(12) United States Patent
Muehlhausen et al.

(10) Patent No.: US 12,171,060 B2
(45) Date of Patent: Dec. 17, 2024

(54) DEVICE FOR TEMPERATURE MEASUREMENT

(71) Applicant: SMA Solar Technology AG, Niestetal (DE)

(72) Inventors: Felix Muehlhausen, Kassel (DE); Simon Butterweck, Helsa (DE)

(73) Assignee: SMA Solar Technology AG, Niestetal (DE)

(*) Notice: Subject to any disclaimer, the term of this patent is extended or adjusted under 35 U.S.C. 154(b) by 144 days.

(21) Appl. No.: 17/956,858

(22) Filed: Sep. 30, 2022

(65) Prior Publication Data

US 2023/0021547 A1 Jan. 26, 2023

Related U.S. Application Data

(63) Continuation of application No. PCT/EP2021/057404, filed on Mar. 23, 2021.

(30) Foreign Application Priority Data

Mar. 30, 2020 (DE) ............ 10 2020 108 690.3

(51) Int. Cl.
*H05K 1/02* (2006.01)
*G01K 1/02* (2021.01)
(Continued)

(52) U.S. Cl.
CPC ........... *H05K 1/0284* (2013.01); *G01K 1/143* (2013.01); *G01R 1/203* (2013.01); *G01R 19/32* (2013.01);
(Continued)

(58) Field of Classification Search
CPC ...... H05K 1/02; H05K 1/0201; H05K 1/0284; H05K 1/18; H05K 1/143; H05K 1/203;
(Continued)

(56) References Cited

U.S. PATENT DOCUMENTS 10,782,196 B2   9/2020   Caltabiano
11,067,606 B2   7/2021   Li et al.
(Continued)

FOREIGN PATENT DOCUMENTS

DE   102011004174 A1   8/2012
EP      1435524 A1     7/2004
(Continued)

OTHER PUBLICATIONS

International Search Report dated Jun. 23, 2021 in connection with PCT/EP2021/057404.

*Primary Examiner* — Xiaoliang Chen
(74) *Attorney, Agent, or Firm* — Eschweiler & Potashnik, LLC

(57) ABSTRACT

A device for current determination includes a shunt and a device for temperature measurement including a printed circuit board, an evaluation unit and a temperature sensor. The printed circuit board has a milled groove which runs spirally around the temperature sensor, so that the temperature sensor is arranged on a printed circuit board plateau defined by the milled groove and is displaceable in a direction that is parallel to a normal vector of a plane defined by the printed circuit board. When the temperature sensor is displaced relative to the plane of the printed circuit board, a restoring force is brought about between the printed circuit board and the temperature sensor, wherein the shunt includes a resistance region having a substantially flat surface, wherein the device for current determination is arranged in the resistance region on the surface of the shunt in such a way that the temperature sensor is arranged in thermal connection with the resistance region of the shunt, wherein voltage taps are arranged on both sides of the temperature sensor and electrically contact the surface of the (Continued)

shunt in order to detect a potential difference along the resistance region.

11 Claims, 4 Drawing Sheets

(51) Int. Cl.
| | |
|---|---|
| *G01K 1/024* | (2021.01) |
| *G01K 1/14* | (2021.01) |
| *G01K 1/143* | (2021.01) |
| *G01K 11/22* | (2006.01) |
| *G01K 13/02* | (2021.01) |
| *G01K 13/20* | (2021.01) |
| *G01R 1/20* | (2006.01) |
| *G01R 19/32* | (2006.01) |
| *H05K 1/18* | (2006.01) |
| *H05K 3/00* | (2006.01) |
| *H05K 3/44* | (2006.01) |
| *H05K 5/03* | (2006.01) |
| *H05K 5/04* | (2006.01) |
| *H05K 7/20* | (2006.01) |
| *H05K 9/00* | (2006.01) |

(52) U.S. Cl.
CPC .............. *H05K 1/18* (2013.01); *H05K 3/0044* (2013.01); *H05K 2201/09045* (2013.01); *H05K 2201/10151* (2013.01); *H05K 2203/0228* (2013.01)

(58) Field of Classification Search
CPC .......... H05K 3/0044; H05K 5/03; H05K 5/04; H05K 7/20; H05K 7/209; H05K 7/2047; H05K 9/00; H05K 9/0075; G01K 1/02; G01K 1/024; G01K 1/14; G01K 1/143; G01K 3/005; G01K 11/22; G01K 13/02; G01K 13/20
USPC .......................... 361/782; 700/278; 374/100
See application file for complete search history.

(56) References Cited

U.S. PATENT DOCUMENTS

| | | | |
|---|---|---|---|
| 2003/0057770 A1 | 3/2003 | Heim | |
| 2007/0093084 A1 | 4/2007 | Chen | |
| 2009/0129432 A1* | 5/2009 | Luniewski | H01L 25/162 |
| | | | 374/E1.001 |
| 2014/0324232 A1* | 10/2014 | Modi | H04W 4/80 |
| | | | 700/278 |
| 2017/0115167 A1* | 4/2017 | Fujiwara | G03F 1/44 |
| 2017/0284873 A1* | 10/2017 | Disselnkoetter | G01K 13/02 |
| 2019/0049315 A1* | 2/2019 | Larsen | G01K 1/143 |
| 2019/0221353 A1* | 7/2019 | Hwang | H02J 50/10 |
| 2021/0204819 A1* | 7/2021 | Kim | G16H 50/20 |
| 2022/0079438 A1* | 3/2022 | Baek | A61B 5/002 |
| 2022/0185132 A1* | 6/2022 | Næsje | B60L 53/302 |

FOREIGN PATENT DOCUMENTS

| | | |
|---|---|---|
| EP | 3537129 A2 | 9/2019 |
| EP | 3620799 A1 | 3/2020 |

* cited by examiner

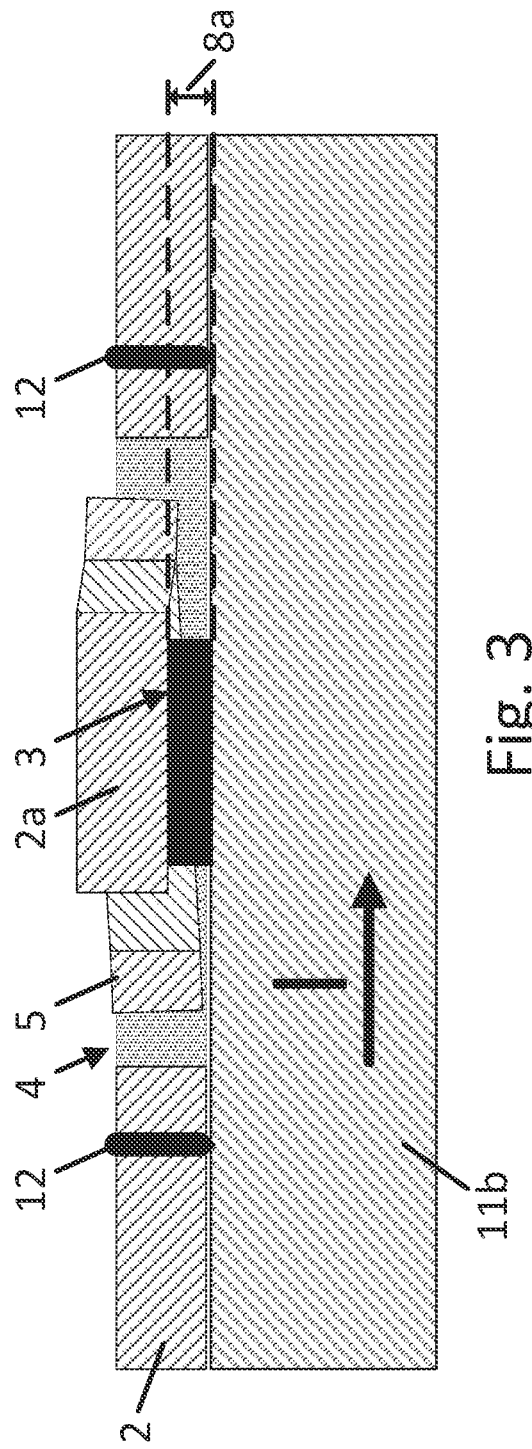

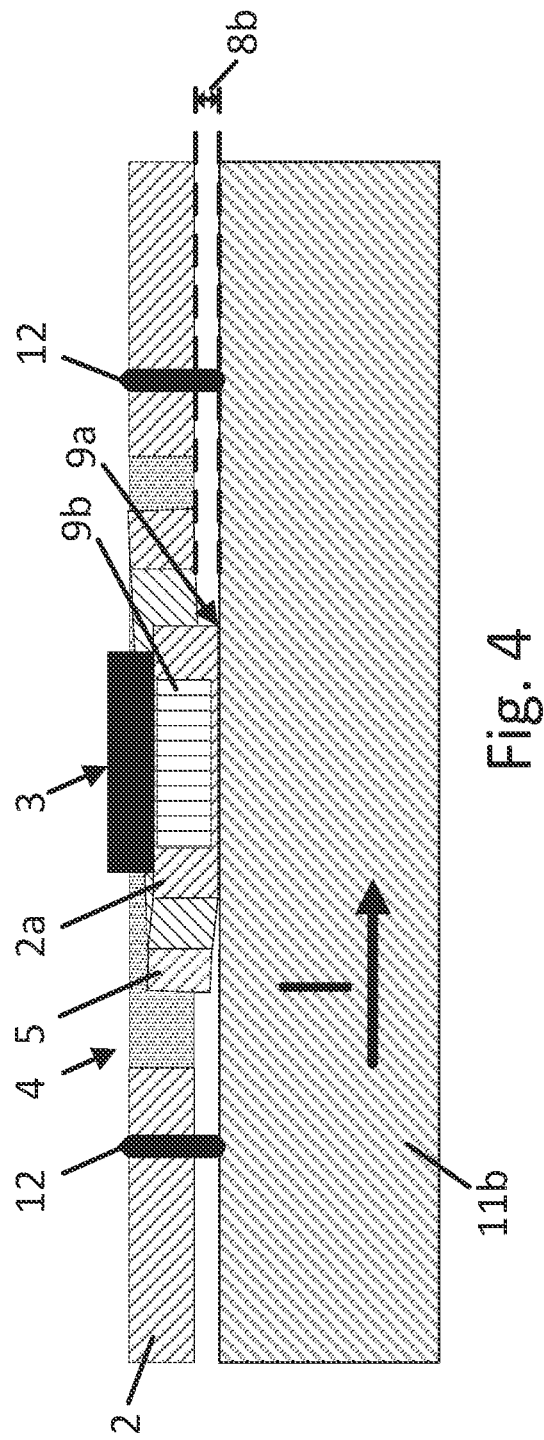

DEVICE FOR TEMPERATURE MEASUREMENT

CROSS REFERENCE TO RELATED APPLICATIONS

This application is a continuation of International Patent Application No. PCT/EP2021/057404, filed on Mar. 23, 2021, which claims priority to German Patent Application no. 10 2020 108 690.3, filed on Mar. 30, 2020, and is hereby incorporated by reference in its entirety.

FIELD

The disclosure relates to a device for temperature measurement, a device for current determination having a temperature measuring assembly, and an electrical power converter having a current determining assembly.

BACKGROUND

Precise measurement of the temperature of an object using a temperature sensor, for example, using a temperature-dependent resistor, generally requires good thermal contact between the temperature sensor and the object to be measured. In this case, the temperature sensor, as well as an associated evaluation electronics unit, can be arranged on a printed circuit board so that, during operation, the temperature sensor is located between the printed circuit board and a surface of the object to be measured. However, this arrangement requires the printed circuit board itself to be spaced from the surface by at least the overall height of the temperature sensor.

Low-resistance measuring resistors, so-called shunts, can be used for precise determination of electrical currents, in particular, high currents in the range of a few kiloamperes. For example, a measuring arrangement for measuring a current is known from DE 10 2016 010 012 B4, in which pairs of voltage taps measure a voltage drop across a resistor element, wherein a measuring circuit determines a measure of the electric current flowing through the resistor element from the voltage drop and the resistance value of the resistor element on the basis of Ohm's law. The resistance value of the resistor element is temperature-dependent, so that a temperature sensor is arranged on the resistor element and the measuring circuit adjusts the resistance value used to determine the current intensity as a function of the temperature measured by the temperature sensor.

In particular, if the resistor element is made of a common material which has very good conductivity, for example copper, but the resistivity of which is strongly temperature-dependent, the temperature of the resistor material must be measured exactly where the relevant voltage drop also occurs. An arrangement of the temperature sensor on a side of a printed circuit board facing the resistor element, which is known per se, allows a good thermal connection to the resistor element, but causes a distance between the printed circuit board and the resistor element which is at least of the same order of magnitude as the overall height of the temperature sensor.

In addition, it is desirable to arrange the connections between the voltage taps and the measuring circuit very close to the resistor element, in particular, to avoid conductor loops. Conductor loops, in particular, in the vicinity of high currents, can lead to considerable impairment or distortion of the measurement due to electromagnetic effects, especially if the currents contain periodic or transient components.

To avoid such conductor loops, it is possible to arrange the temperature sensor on the side of the printed circuit board facing away from the resistor element, so that the printed circuit board with the connections between the voltage taps and the measuring circuit can be arranged as close as possible to the resistor element. However, this increases the thermal resistance between the temperature sensor and the busbar, since the heat flow from the resistor element must first enter and penetrate the printed circuit board.

Another possibility would be to mount the temperature sensor on the side of the shunt opposite the printed circuit board, see again DE 10 2016 010 012 B4. However, this requires additional connections between the temperature sensor and the measuring circuit, which run outside the printed circuit board and thus cause additional assembly work and costs. In addition, for sufficiently good temperature measurement, the temperature sensor must be pressed against the surface to be measured, but the pressure must not be too high so as not to damage the temperature sensor.

DE 10 2011 004 174 A1 describes an electrical connection arrangement in which a printed circuit board has a height-flexible printed circuit board region in which an electronic component can be arranged. The component is mechanically connected here to a functional unit and thus fixed in position, wherein the mechanical connection to the functional unit can be improved by additional spring elements between the printed circuit board and the component.

SUMMARY

The disclosure is directed to a device for temperature measurement which ensures a good thermal contact of a temperature sensor with the surface of an object to be measured, as well as a device for current determination in which a voltage drop across a resistor element with a temperature-dependent resistance value can be measured without interference, wherein the current is determined from the voltage drop and a resistance value which is adjusted by means of an exact measurement of the temperature of the resistor element.

In one embodiment, a device for temperature measurement comprises a printed circuit board, an evaluation unit and a temperature sensor. The printed circuit board has a milled groove which runs substantially spirally around the temperature sensor, so that the temperature sensor is arranged on a printed circuit board plateau and is displaceable parallel to the normal vector of the plane of the printed circuit board. When the temperature sensor is displaced relative to the plane of the printed circuit board, a restoring force is brought about between the printed circuit board and the temperature sensor.

The device for temperature measurement is, in one embodiment, suited to be placed directly on a surface of an object for which the temperature is to be detected by the temperature sensor. For this purpose, the temperature sensor can be arranged on a printed circuit board plateau which is located in the center of the spiraled milled groove and thus at the inner end of the remaining printed circuit board web formed by the milled groove. When the printed circuit board is placed flush with the surface of the object to be measured with the temperature sensor between the printed circuit board and the surface, the printed circuit board plateau is pushed out of the plane of the printed circuit board by the height of the temperature sensor so that both the printed circuit board itself and the temperature sensor can rest against the surface. This simplifies, for example, the mounting of the device for temperature measurement on the surface of the object to be measured.

The temperature sensor is, in one embodiment, spring-mounted by a printed circuit board web remaining between the turns of the spiraled milled groove. The likewise spiraled remaining printed circuit board web produces a spring effect on the printed circuit board plateau and thus on the temperature sensor when the printed circuit board plateau is moved out of the plane of the printed circuit board. In particular, this occurs when the printed circuit board is placed flat on the surface of the object to be measured and the milled groove that runs around the temperature sensor ensures a height compensation so that the temperature sensor is moved parallel to the normal vector of the plane of the printed circuit board. The temperature sensor can thus be displaceable by a spring travel which comprises at least its overall height.

In one embodiment, the milled groove in the printed circuit board may run along a continuous spiral shape. In this case, the spiral shape can comprise a plurality of substantially straight portions and changes in direction between the portions, wherein the changes in direction in particular produce a substantially right angle between the portions; in this case, the changes in direction themselves can be continuous, that is to say for example can comprise a quarter circle. In particular, a continuous spiral shape is particularly easy to produce in one go and has a readily reproducible restoring force when the printed circuit board plateau is displaced out of the plane of the printed circuit board.

In one embodiment, the milled groove can be formed in such a way that a radius vector of the trajectory of the milled groove sweeps over an angle of at least 600 degrees, for example, at least 700 degrees, so that the remaining printed circuit board web runs around the temperature sensor by at least three quarters, for example, at least once. As a result, a displacement of the printed circuit board plateau by the height of the temperature sensor out of the plane of the printed circuit board leads to an elastic deformation of the remaining printed circuit board web which is safely below a limit to the plastic deformation of the printed circuit board material, so that a restoring force of the printed circuit board web is permanently maintained and is not significantly reduced even under the influence of temperatures above 100 degrees Celsius.

In the case of a design with straight portions, the number of straight portions can be selected so that the sum of the angles of the changes of direction between the straight portions reaches the aforementioned numbers of degrees. For example, in one embodiment the case of right-angled changes of direction, more than six portions should be provided.

In one embodiment of the device, the width of the printed circuit board web, the width of the milled groove and the length of the milled groove can be configured such that the restoring force between the printed circuit board and the temperature sensor is between 0.1 and 10 Newtons, for example, between 1 and 5 Newtons, when the temperature sensor is displaced by its overall height parallel to the normal vector of the plane of the printed circuit board. As a result, when the printed circuit board and the temperature sensor are placed flat on the surface of the object to be measured, a force acts on the temperature sensor that ensures reliable thermal contact of the temperature sensor with the surface. Specifically, the printed circuit board can have a thickness of between 0.5 and 3 millimeters, while the milled groove and the remaining printed circuit board web can each have a width of between 0.3 and 3 millimeters.

In one embodiment, the outer edge of the milled groove encloses an area smaller than 200 square millimeters, for example, smaller than 100 square millimeters. This allows the use of a temperature sensor with a small housing that occupies substantially the entire area of the printed circuit board plateau, wherein any peripheral components on the printed circuit board can be arranged very close to the temperature sensor, for example, also on the side of the printed circuit board level facing away from the temperature sensor.

For contacting the temperature sensor with an evaluation unit, electrical conductor tracks can run along the remaining printed circuit board web in one embodiment. The conductor tracks can have a width of between 50 and 1000 micrometers and can be spaced between 50 and 1000 micrometers apart from one another. In one embodiment, this eliminates the need for external contacting of the temperature sensor via wires, cables or the like.

The temperature sensor can be embodied as a passive component that is connected to the evaluation unit via at least two conductor tracks. Alternatively, the temperature sensor can be configured as an active component and connected to the evaluation unit via at least three conductor tracks.

In one embodiment of the device, the temperature sensor may be arranged on a first printed circuit board side and the evaluation unit may be arranged on a second printed circuit board side, so that the evaluation unit is arranged on the side of the printed circuit board opposite the temperature sensor. In one embodiment, the first printed circuit board side can comprise substantially only the temperature sensor, while all other components are arranged on the second side opposite the temperature sensor. This makes it possible, in one embodiment, for the first printed circuit board side with the spring-mounted temperature sensor to lie flush with the surface of the object to be measured. The conductor tracks between the temperature sensor and the evaluation unit can have through-platings here running through the printed circuit board.

In one embodiment, the temperature sensor and the evaluation unit can be arranged on the same side of the printed circuit board. This allows a thermal connection to be made between the underside of the temperature sensor and the surface of the object to be measured via the printed circuit board, wherein the printed circuit board can be optimized in terms of thermal conductivity at the location of the temperature sensor.

In one embodiment, a device for current determination comprises a shunt and a device for temperature measurement as described above. The shunt has two connection regions and a resistance region electrically located between the connection regions and having a substantially flat surface. The device for current determination is arranged in the resistance region on the surface of the shunt in such a way that the temperature sensor is arranged in thermal connection with the resistance region of the shunt. Here, voltage taps are arranged on both sides of the temperature sensor to electrically contact the surface of the shunt in order to detect a potential difference along the resistance region.

In one embodiment of the device, the printed circuit board lies flat on the shunt so that the voltage taps are electrically contacted with the surface of the shunt and the temperature sensor lies on the surface of the shunt. In this case, the temperature sensor is displaced by its overall height relative to the plane of the printed circuit board in the assembled state of the device, so that the remaining printed circuit board web exerts a restoring force on the printed circuit board plateau and thus a contact pressure on the temperature sensor. With this embodiment, the main requirements for the device for current determination are optimally met in that the temperature sensor is placed directly on the resistance region and is optimally thermally connected to the resistor material by the spring action of the remaining printed circuit board web, so that a temperature measurement with high accuracy can be achieved. In addition, the temperature sensor can be placed centrally in the resistance region and centrally between the voltage taps, so that the temperature is measured in exactly that region in which the voltage drop due to a current flowing through the shunt is also measured. In this way, temperature-related changes in the resistance of the material in the resistance region of the shunt can be optimally compensated for when determining the current flowing through the shunt. At the same time, the printed circuit board rests largely without distance on the surface of the resistance region, so that the conductor tracks in the printed circuit board, which connect the voltage taps to a measuring circuit for determining the voltage dropping between the voltage taps, also lie closely against the surface of the resistance region and conductor loops are largely avoided during the voltage measurement.

In one embodiment of the device, the temperature sensor and the evaluation unit are arranged on the side of the printed circuit board opposite the shunt. In this case, the printed circuit board plateau is mechanically connected to the surface of the shunt, wherein the printed circuit board plateau is displaceable relative to the plane of the printed circuit board. For example, the side of the printed circuit board plateau opposite the temperature sensor can be connected to the shunt, for example, by means of an adhesive. In this case, any offset between the plane of the printed circuit board and the surface of the shunt is compensated for at the location of the printed circuit board plateau by displacing the printed circuit board plateau, and thus the temperature sensor, by the offset relative to their rest position in the plane of the printed circuit board. This embodiment also optimally fulfills the requirements of the device for current determination, since the temperature sensor is optimally thermally connected to the resistor material, for example, by its underside across the printed circuit board plateau, and remains so even if the position of the printed circuit board relative to the surface of the shunt should change.

The thermal connection of the underside of the temperature sensor can be further improved by the printed circuit board plateau having a heat conductor, for example, a metal insert or a plurality of copper layers at least partially connected to one another. Starting from a state in which the printed circuit board is arranged on the shunt in a manner as flush as possible with the surface, thermal and electromechanical effects acting on the shunt at high operating currents, for example, can cause deformation of the shunt and/or the printed circuit board, resulting in an at least partial lifting of the printed circuit board from the shunt. This then does not affect the thermal connection of the temperature sensor to the shunt, since the printed circuit board plateau is mechanically fixed to the shunt and compensates for the offset between the plane of the printed circuit board and the surface of the shunt.

In one embodiment, the voltage taps can be arranged symmetrically around the temperature sensor and can optionally be embodied as press-fit pins in the printed circuit board and/or shunt, as spring contacts, as solder connections, or as screw connections to the shunt.

In one embodiment, the shunt may be configured to allow currents to pass through of which the current intensity is greater than 100 amperes, for example, greater than 1000 amperes. In this case, the shunt can be formed in one piece from one material, wherein the resistance region is formed substantially by a tapering of the cross-section relative to the cross-section of the connection regions of the shunt. This avoids material transitions and reduces production and assembly costs.

Alternatively, the resistance region of the shunt may be made of a different material than the connection regions, for example, of a material with different electrical properties, and may optionally comprise a tapering of the cross-section of the shunt. In this case, a further improved accuracy of the current determination can be achieved by knowing the electrical properties of the material in the resistance region more precisely than those of the material of the connection regions, for example, with regard to the temperature dependence of the resistivity of the material in the resistance region. It is not absolutely necessary here to use a material with a particularly low temperature dependence of the resistivity in the resistance region of the shunt; rather, it is sufficient to know and/or determine the temperature dependence as precisely and reproducibly as possible.

In one embodiment, the tapering of the cross-section of the shunt in the resistance region may comprise a reduction in the cross-section to a value between 10 and 60 percent of the cross-section of the connection regions of the shunt. This results in a higher current density in the resistance region than in the connection regions of the shunt, which in turn results in a higher voltage drop for a given current flowing through the shunt. This locally increased current density is accompanied by an increased temperature in the resistance region; however, this effect is neutralized by temperature compensation using the temperature measurement representative of the resistance region and is overcompensated by confinement to a locally limited and well-defined measurement range.

To avoid any undesirable electrical contact, an electrically insulating foil can be arranged between the temperature sensor and the surface of the shunt.

A power converter has current-carrying lines for conducting direct and/or alternating currents processed by the power converter. At least one of the current-carrying lines comprises a device for current determination according to the preceding description, wherein the device bridges an interruption of the current-carrying lines or is integrated into the current-carrying lines. The power converter is set up to determine a current flowing through the current-carrying lines during operation of the power converter from a potential difference along the resistance region of the shunt detected by means of the voltage taps and a resistance value of the resistance region, wherein the resistance value used to calculate the current intensity accordingly is a function of the temperature detected by the temperature sensor.

In one embodiment, the power converter is configured for a rated power that is greater than 10 kW, for example, greater than 100 kW, or greater than 1000 kW. In these power classes, a determination of the direct and/or alternating currents processed by the power converter is particularly demanding due to their correspondingly high amplitudes and can be carried out particularly accurately using the described device for current determination, wherein the described device for current determination can be integrated particularly easily into the structure of the power converter.

BRIEF DESCRIPTION OF THE FIGURES

In the following, the disclosure is further explained and described with reference to example embodiments shown in the figures.

FIG. 3 shows a cross-section through an embodiment of the device for current determination,
and
FIG. 4 shows a cross-section through a further embodiment of the device for current determination.

DETAILED DESCRIPTION

Figure 1:
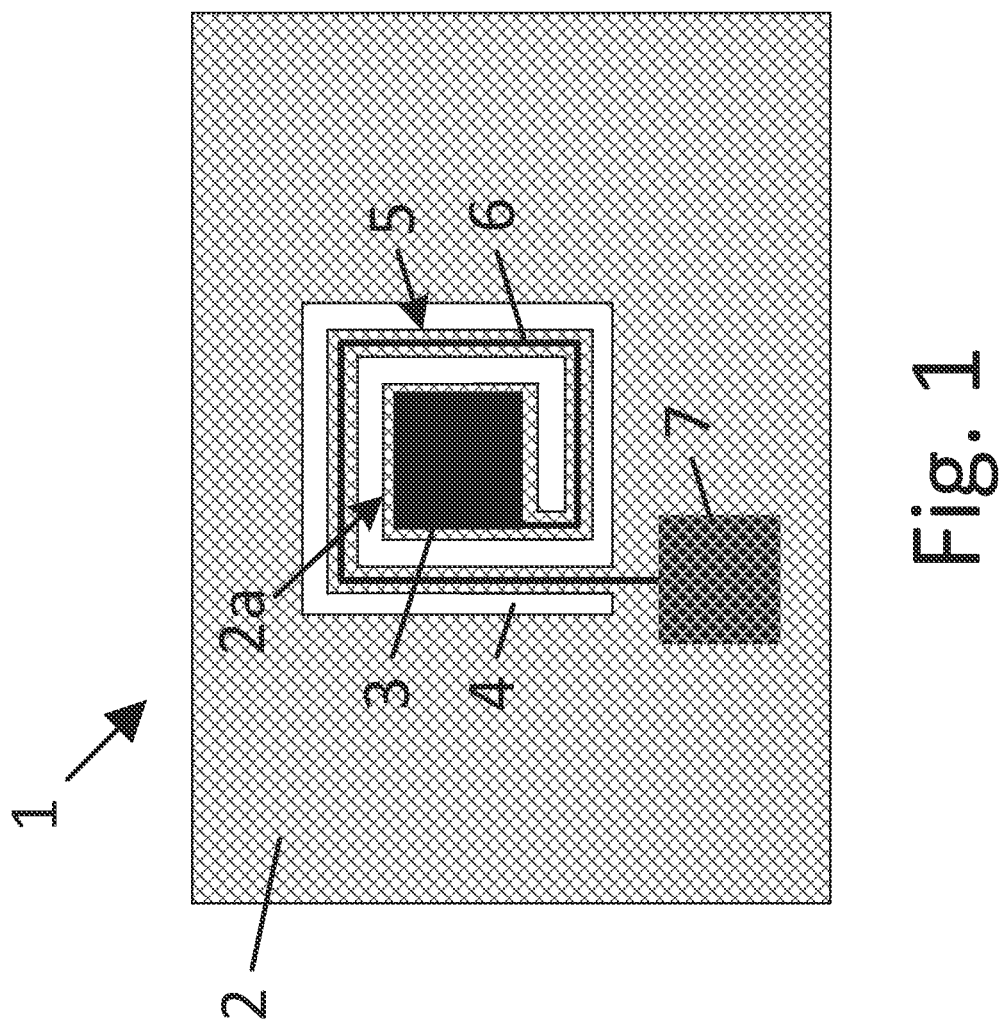
FIG. 1 shows a device for temperature measurement.

FIG. 1 shows a temperature measuring assembly 1 as an embodiment of a device for temperature measurement according to the application. The temperature measuring assembly 1 comprises a printed circuit board 2. A temperature sensor 3 is arranged on the printed circuit board 2. A milled groove 4 runs around the temperature sensor 3 in the printed circuit board 2. The milled groove 4 may have been made in the printed circuit board 2 prior to the component placement on the printed circuit board 2 or subsequently after the component placement process. The milled groove 4 runs substantially spirally around the temperature sensor 3, leaving a printed circuit board web 5 which is bounded on both sides by the milled groove 4 and also runs substantially spirally.

The spiral shape along which the milled groove 4 runs can be embodied here in different ways; in particular, it can have substantially straight portions and substantially right-angled changes of direction (see FIG. 1), or it can be composed of arc segments with different radii. It is also conceivable to provide non-rectangular changes of direction. It is understood that, for manufacturing reasons, certain minimum radii are always unavoidable when milling out a change of direction. Therefore, a change of direction usually comprises an arc, and in the case of a 90 degree bend, this may in particular be a quarter circle. This means that the milled groove 4 can be produced inexpensively in one go and in particular with a standard tool.

At the end of the remaining printed circuit board web 5 there is located a printed circuit board plateau 2a on which the temperature sensor 3 is arranged. The printed circuit board plateau 2a is completely surrounded by the milled groove 4. In addition, the remaining printed circuit board web 5 runs once around the printed circuit board plateau 2a. A radius vector of the trajectory of the milled groove 4, i.e., a vector from the center of the printed circuit board plateau 2a to a point of the milled groove 4 in this case runs approximately twice around the temperature sensor 3, i.e., it sweeps an angle of approximately 700 degrees from the beginning to the end of the milled groove 4 according to FIG. 1. In alternative embodiments, the milled groove 4 may also be shorter and may run around the temperature sensor 3, for example only one and a half times or one and three-quarter times, corresponding to an angle of about 500 degrees or 600 degrees, respectively.

The temperature measuring assembly 1 further comprises an evaluation unit 7. The evaluation unit 7 can be arranged on the same side of the printed circuit board 2 as the temperature sensor 3 or on the opposite side. The temperature sensor 3 is connected to the evaluation unit 7 via conductor tracks 6. The conductor tracks 6 run here along the remaining printed circuit board web 5.

The temperature sensor 3 can be embodied as an active or passive component. An active temperature sensor 3 must generally be connected to the evaluation unit 7 via at least three lines, while a passive temperature sensor 3 is connected to the evaluation unit 7 via two to four lines. Accordingly, the conductor tracks 6 comprise a suitable number of individual lines which run next to one another or also one above the other in the remaining printed circuit board web 5. If an active component is used as the temperature sensor 3, the evaluation unit 7 can also be arranged outside the printed circuit board 2, for example on another assembly, so that the temperature sensor 3 can be connected to a suitable programmable logic or a microcontroller via the conductor tracks 6 and further wiring.

Figure 2:
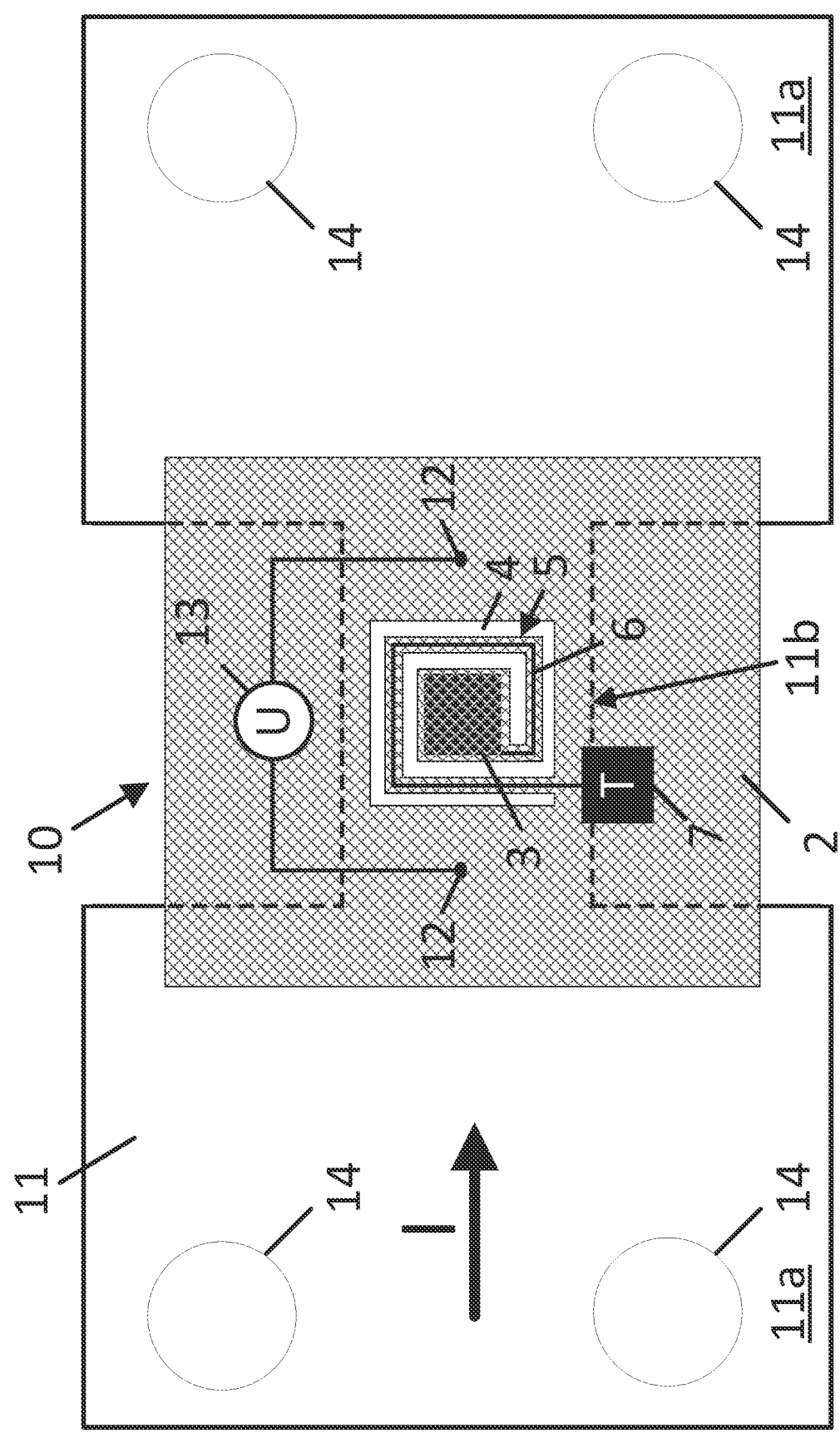
FIG. 2 shows a device for current determination.

FIG. 2 shows a device for current determination having a current determination assembly 10 and a shunt 11. In this example, the shunt 11 is formed in one piece and comprises connection regions 11a and a resistance region 11b. Here, the connection regions 11a are configured to be connected to a busbar that is part of a power converter, for example, and carries high direct currents or alternating currents. For this purpose, the shunt 11 can bridge an interruption in the busbar or can itself form the busbar, for example by an input terminal or a semiconductor circuit of the power converter being connectable to one end of the shunt 11 and/or by an inductor or a relay being connectable to the other end of the shunt 11. Alternatively or additionally, the connection regions 11a may be formed for connection to other types of current-carrying lines, for example cables, and may have connecting elements 14 for electrical and/or mechanical connection to adjacent components. In principle, the resistance region 11b can also be integrated into a current-carrying line in such a way that the connection regions 11a merely designate the points of electrical contact between the resistance region 11b and adjacent components.

In one embodiment, the current determination assembly 10 has a device for temperature measurement according to FIG. 1 with a printed circuit board 2, a temperature sensor 3 and a milled groove 4 running around the temperature sensor 3. The temperature sensor 3 can be arranged on the side of the printed circuit board 2 facing the shunt 11, i.e. between the printed circuit board 2 and the surface of the resistance region 11b, see FIG. 3. The temperature sensor 3 can also be arranged on the side of the printed circuit board 2 opposite the shunt 11, i.e. on the same side as the evaluation unit 7, see FIG. 4. In addition, the current determination assembly 10 has two voltage taps 12, which are arranged along the flow direction of the current I in front of and behind the temperature sensor 3 and are electrically conductively connected to the surface of the resistance region 11b. The voltage taps 12 are connected to a voltmeter 13 that detects a voltage difference between the potentials on the surface of the resistance region 11b at the positions of the voltage taps 12.

An evaluation unit, not shown here, which can be combined with the evaluation unit 7 or embodied separately from it, can determine the amplitude of a current I flowing through the shunt 11 on the basis of Ohm's law from the measured values of the voltmeter 13 and the electrical resistance of the resistance region 11b. In this case, the electrical resistance of the resistance region 11b is generally temperature-dependent. Therefore, the electrical resistance used mathematically in determining the current intensity is specified as a function of the temperature of the resistance region 11b determined by the temperature sensor 3.

The resistance region 11b, in one embodiment, has a cross-section that is smaller than the cross-section of the connection regions 11a. As a result, the current density of a current I flowing through the shunt 11 is increased in the resistance region 11b compared to the connection regions 11a. Since in one embodiment the shunt 11 is inherently optimized for the lowest possible losses, increasing the current density in the resistance region 11b is advantageous for producing a voltage difference between the voltage taps 12 that is high enough to be safely within the measuring range of the voltmeter 13. Alternatively or in addition to the tapering of the cross-section according to FIG. 2, the resistance region 11b can have a different material composition than the connection regions 11a, for example, a material with a (slightly) increased electrical resistance and/or a reduced temperature dependence of the electrical resistance.

FIG. 3 shows a cross-section through the current determination device according to FIG. 2 in line with the resistance region 11b according to one embodiment. The printed circuit board 2 lies flush on the surface of the shunt 11. The temperature sensor 3 is arranged on the side of the printed circuit board 2 facing the shunt 11, i.e. between the printed circuit board 2 and the surface of the resistance region 11b, and also rests on the surface of the resistance region 11b. As a result, relative to its rest position in the unmounted state of the printed circuit board 2, the temperature sensor 3 has shifted by its overall height 8a with respect to the plane of the printed circuit board 2, in that the printed circuit board plateau 2a is offset by the overall height 8a parallel to the normal vector of the plane of the printed circuit board 2. This is possible because the printed circuit board plateau 2a is connected to the rest of the printed circuit board 2 only by the remaining printed circuit board web 5. The offset of the printed circuit board plateau 2a by the height 8a is thus distributed over an elastic deformation of the entire printed circuit board web 5 with a moderate slope relative to the plane of the printed circuit board 2.

In one embodiment, the elastic deformation of the printed circuit board web 5 causes a restoring force that presses the temperature sensor 3 onto the surface of the resistance region 11b. At the same time, the voltage taps 12 are pressed onto the surface of the resistance region 11b by the printed circuit board 2 itself and are thus brought into electrical contact. Alternatively or additionally, the voltage taps 12 may also themselves provide the mechanical connection between the printed circuit board 2 and the shunt 11, for example in that the voltage taps 11 are formed as press-fit contacts which are pressed into corresponding holes in the printed circuit board 2 and the surface of the shunt 11. Other methods for electrical and/or mechanical contacting of the voltage taps 12 with the resistance region 11b are also conceivable, for example, via spring pins, screw or solder connections, or the like.

In particular, the offset of the printed circuit board plateau 2a made possible by the milled groove 4 allows the printed circuit board 2 to be arranged flush with the surface of the resistance region 11b, even though the temperature sensor 3 is arranged between the printed circuit board 2 and the surface of the shunt 11. As a result, the electrical connections necessary for measuring the voltage drop between the voltage taps 12, in particular, the lines between the voltage taps 12 and the voltmeter 13, can run in the immediate vicinity of the surface of the resistance region 11b, and conductor loops which are unfavorable in this respect, in particular oriented perpendicular to the surface of the shunt 11, can be largely minimized.

FIG. 4 shows a cross-section through a further embodiment of the device for current determination according to FIG. 2 in line with the resistance region 11b. The temperature sensor 3 is arranged on the side of the printed circuit board 2 opposite the shunt 11, i.e. on the same side as the evaluation unit 7. The printed circuit board plateau 2a, on which the temperature sensor 3 is arranged, rests on the surface of the resistance region 11b and is mechanically connected to the shunt 11, for example, by means of an adhesive 9a, which can be embodied as a thermally conductive adhesive and optimized for high thermal conductivity. A thermal conductor 9b, for example a copper inlay or a plurality of copper layers at least partially connected to each other, may be arranged in the printed circuit board plateau 2a, thus improving the thermal connection between the underside of the temperature sensor 3 and the side of the printed circuit board plate 2a facing the shunt 11.

In one embodiment, the printed circuit board 2 may have a certain offset 8b from the surface of the shunt 11. This offset may be deliberately chosen, for example for design reasons. An offset of the plane of the printed circuit board 2 from the surface of the shunt 11 may also be minimized at the time of manufacture, in particular, by the printed circuit board resting flat on the shunt 11; after assembly, however, an additional offset may occur, in particular at the location of the printed circuit board plateau 2a, for example if the shunt 11 and/or the printed circuit board 2 should deform. An inherently undesirable deformation of the shunt 11 can be caused, for example, by the action of mechanical forces during assembly or transport as well as by thermal expansion and/or electromagnetic forces occurring during operation, in particular, if the shunt 11 is mechanically fixed in the connection regions 11a by means of the connecting elements 14.

The mechanical connection of the printed circuit board plateau 2a to the shunt 11 causes the temperature sensor 3 to be displaced parallel to the normal vector of the plane of the printed circuit board 2, namely by the same amount as the specific offset between the printed circuit board 2 and the surface of the shunt 11 at the location of the printed circuit board plateau 2a. This is possible because the printed circuit board plateau 2a is connected to the rest of the printed circuit board 2 only by the remaining printed circuit board web 5. The offset of the printed circuit board 2 with respect to the surface of the shunt 11 is distributed here over an elastic deformation of the entire printed circuit board web 5 with a moderate slope with respect to the plane of the printed circuit board 2. The offset here generates a restoring force between the fixed printed circuit board level 2a and the printed circuit board 2, so that the printed circuit board 2 is pulled by the printed circuit board web 5 in addition to the shunt 11. Additionally, the printed circuit board web 5 allows for compensation of any lateral offset of the printed circuit board 2 from a nominal installation position.

In this case, the voltage taps 12 are electrically and mechanically connected to the resistance region 11b, for example, via press-fit contacts, spring pins, screw, plug-in or solder connections, or the like.

The milled groove 4 thus allows the printed circuit board 2 to be offset and at the same time ensures the thermal connection between the temperature sensor 3 and the resistance region 11b. As a result, a certain amount of deformation of the shunt 11 can be tolerated during operation. Alternatively or additionally, the requirements for the dimensional stability of the shunt 11 can be reduced depending on the thermal and/or mechanical boundary conditions, for example, by making the shunt 11 thinner overall and more economical correspondingly.

In the embodiment shown in FIG. 4, the underside of the temperature sensor 3 is thermally connected to the resistance region 11b of the shunt 11 via the printed circuit board plateau 2a. In this case, the temperature sensor 3 can be decoupled from the surrounding air by means of a hood, so that the top side of the temperature sensor 3 is not influenced by any airflow above the printed circuit board 2, but is largely in thermal equilibrium exclusively with the resistance region. This further improves the measurement of the temperature of the resistance region.

What is claimed is:

1. A device for current determination comprising a shunt and a device for temperature measurement comprising a printed circuit board, an evaluation unit and a temperature sensor, wherein the printed circuit board has a milled groove which runs spirally around the temperature sensor, so that the temperature sensor is arranged on a printed circuit board plateau defined by the milled groove and is displaceable in a direction that is parallel to a normal vector of a plane defined by the printed circuit board and, when the temperature sensor is displaced relative to the plane of the printed circuit board, a restoring force is brought about between the printed circuit board and the temperature sensor, wherein the shunt comprises a resistance region having a substantially flat surface, wherein the device for current determination is arranged in the resistance region on the surface of the shunt in such a way that the temperature sensor is arranged in thermal connection with the resistance region of the shunt, wherein voltage taps are arranged on both sides of the temperature sensor and electrically contact the surface of the shunt in order to detect a potential difference along the resistance region.

2. The device as claimed in claim 1, wherein the printed circuit board lies flat on the shunt so that the voltage taps are electrically contacted with the surface of the shunt and the temperature sensor lies on the surface of the shunt, wherein the temperature sensor is displaced by its overall height relative to the plane of the printed circuit board, so that a remaining printed circuit board web exerts a restoring force on the printed circuit board plateau and thus a contact pressure on the temperature sensor.

3. The device as claimed in claim 1, wherein the temperature sensor and the evaluation unit are arranged on a side of the printed circuit board opposite the shunt, wherein the printed circuit board plateau is mechanically connected to a surface of the shunt, wherein the printed circuit board plateau is displaceable relative to the plane of the printed circuit board and compensates for an offset between the plane of the printed circuit board and the surface of the shunt at a location of the printed circuit board plateau.

4. The device as claimed in claim 3, wherein the printed circuit board plateau comprises a heat conductor configured to make a thermal connection between the temperature sensor and the resistance region.

5. The device as claimed in claim 1, wherein the voltage taps comprise press-fit pins in the printed circuit board, as spring contacts, as solder connections, or as screw connections to the shunt.

6. The device as claimed in claim 1, wherein the shunt is configured to allow currents to pass through of which an amplitude thereof is greater than 100 amperes.

7. The device as claimed in claim 1, wherein the shunt comprises two connection regions, wherein the resistance region is disposed between the two connection regions and is formed substantially by a tapering of a cross-section thereof relative to a cross-section of the two connection regions of the shunt.

8. The device as claimed in claim 1, wherein the shunt comprises two connection regions, wherein the resistance region is disposed between the two connection regions and is made of a different material than the two connection regions.

9. The device as claimed in claim 1, wherein the shunt comprises a tapering that comprises a reduction in a cross-section thereof to a value between 10 and 60 percent of a cross-section of two connection regions of the shunt.

10. The device as claimed in claim 2, further comprising an electrically insulating foil arranged between the temperature sensor and the surface of the shunt.

11. The device as claimed in claim 3, wherein the printed circuit board plateau is mechanically connected to a surface of the shunt by means of an adhesive.

\* \* \* \* \*